United States Patent
Miyashita et al.

(10) Patent No.: US 8,289,713 B2
(45) Date of Patent: Oct. 16, 2012

(54) HEAT RADIATION STRUCTURE OF ELECTRIC APPARATUS

(75) Inventors: Toshihito Miyashita, Nagano (JP); Hiroshi Hioki, Nagano (JP); Masakazu Chikyu, Nagano (JP)

(73) Assignee: Sanyo Denki Co., Ltd., Tokyo (JP)

( * ) Notice: Subject to any disclaimer, the term of this patent is extended or adjusted under 35 U.S.C. 154(b) by 251 days.

(21) Appl. No.: 12/787,922

(22) Filed: May 26, 2010

(65) Prior Publication Data
US 2010/0302736 A1    Dec. 2, 2010

(30) Foreign Application Priority Data

May 27, 2009   (JP) .................................. 2009-128065
Apr. 19, 2010  (JP) .................................. 2010-096186

(51) Int. Cl.
*H05K 7/20* (2006.01)
*F28F 7/00* (2006.01)

(52) U.S. Cl. ........ 361/713; 361/702; 361/704; 361/707; 361/709; 361/719; 165/80.2

(58) Field of Classification Search ................. 361/706, 361/702, 704, 707, 709, 713, 719; 165/80.2
See application file for complete search history.

(56) References Cited

U.S. PATENT DOCUMENTS

| | | | |
|---|---|---|---|
| 5,187,642 A * | 2/1993 | Garner et al. ................ 361/719 |
| 5,327,064 A * | 7/1994 | Arakawa et al. .............. 318/801 |
| 5,619,085 A * | 4/1997 | Shramo ......................... 310/184 |
| 6,081,056 A * | 6/2000 | Takagi et al. ................... 310/89 |
| 6,710,504 B2 * | 3/2004 | Ohiwa et al. .................. 310/257 |
| 6,809,457 B1 * | 10/2004 | Horng et al. ................... 310/267 |
| 7,042,122 B1 * | 5/2006 | Dufala et al. ............... 310/68 R |
| 7,058,291 B2 * | 6/2006 | Weaver et al. ................ 318/720 |
| 7,199,496 B2 * | 4/2007 | Suzuki et al. .............. 310/68 R |
| 7,609,523 B1 * | 10/2009 | Ni et al. ......................... 361/715 |
| 7,687,945 B2 * | 3/2010 | Matin et al. ..................... 310/64 |
| 7,847,457 B2 * | 12/2010 | Achor ....................... 310/156.12 |
| 2004/0145860 A1 * | 7/2004 | Shindo .......................... 361/622 |
| 2006/0007638 A1 * | 1/2006 | Fujiyama et al. ............. 361/502 |
| 2007/0252451 A1 * | 11/2007 | Shibuya et al. ................. 310/64 |
| 2007/0253178 A1 * | 11/2007 | Uchiumi et al. ............... 361/807 |
| 2008/0278918 A1 * | 11/2008 | Tominaga et al. ............. 361/719 |

FOREIGN PATENT DOCUMENTS

JP    63-045900    2/1988

* cited by examiner

*Primary Examiner* — Bradley Thomas
(74) *Attorney, Agent, or Firm* — Rankin, Hill & Clark LLP

(57) ABSTRACT

A heat radiation structure of an electric apparatus provided herein is capable of readily releasing heat of electronic components to the outside and suppressing heat conduction to a rotational position sensor. A metal electromagnetic wave shielding member is fixed to a casing body of a casing. The electromagnetic wave shielding member includes a first portion that is connected to an opposed wall portion of the casing body to face a circuit substrate and a cylindrical second portion that is extending from a peripheral end of the first portion and along a peripheral wall portion of the casing body without being in contact with a housing. A heat conductive member having electrical insulating and heat conductivity properties as well as flexibility is disposed between the circuit substrate and the electromagnetic wave shielding member to closely contact both of the plurality of electronic components and the first portion of the electromagnetic wave shielding member.

12 Claims, 8 Drawing Sheets

HEAT RADIATION STRUCTURE OF ELECTRIC APPARATUS

TECHNICAL FIELD

The present invention relates to a heat radiation structure of an electric apparatus and, more specifically, to a heat radiation structure of an electric apparatus constituted from a motor apparatus including a rotational position sensor and a circuit substrate having one or more electronic components mounted thereon.

BACKGROUND ART

An existing motor (an electric device) typically comprises a rotational position sensor disposed on an axial end portion of a shaft of a motor section for detecting a rotational position of the motor section and a circuit substrate disposed outside of the end portion of the shaft on the axial line and having one or more electronic components mounted thereon. In such motor apparatus, detecting accuracy of the rotational position sensor is decreased or a life-span thereof is shortened if heat generated from electronic components is conducted to the rotational position sensor. Accordingly, how to release the heat generated from electronic components to the outside has long been the issue. Japanese Patent Application Publication No. 1992-67758 (JP H04-67758A) discloses a circuit substrate having electronic components mounted thereon is received in a plate-like casing; a metal plate is disposed between the bottom wall of the casing and the circuit substrate; and a synthetic resin is filled into the casing to cover entirely the electronic components. In this manner, heat generated from electronic components is released through the metal plate and the casing. Japanese Patent Application Publication No. 1988-45900 (JP S63-45900A) discloses a heat conductive member having flexibility is connected both to electronic components and a radiation plate so that heat generated from the electronic components may directly be released to the outside via the radiation plate.

SUMMARY OF INVENTION

It is complicated to apply such conventional heat radiation structure to a motor apparatus in which the rotational position sensor and circuit substrate are located on an axial line of a motor shaft and one or more electronic components are mounted on a surface of the circuit substrate. In addition, the conventional heat radiation structure has limitations for increased heat releasing effects.

An object of the present invention is to provide a heat radiation structure of an electric apparatus, which is capable of effectively releasing heat generated by electronic components on a circuit substrate to the outside and suppressing elevation of temperature.

Another object of the present invention is to provide a heat radiation structure of an electric apparatus, which is capable of inhibiting heat conduction from a motor section to an electromagnetic wave shielding member.

Still another object of the present invention is to provide a heat radiation structure of an electric apparatus, which obtains high radiation effects of heat generated from electronic components.

The present invention aims at improvements of a heat radiation structure of an electric apparatus that comprises an electric device including a heat source therein, a housing for the electric device, a casing disposed outside of the housing, and a circuit substrate received in the casing and having a plurality of electronic components mounted thereon. According to the present invention, a heat conductive member having an electrical insulating and heat conductive properties as well as flexibility is disposed between the circuit substrate and the casing and closely attached to the casing. More specifically, the electric apparatus includes a motor section having a shaft whose one end projects from the housing, a rotational position sensor disposed outside of the housing for detecting a rotational position of the shaft. The circuit substrate has the electronic components mounted thereon and disposed more outward than the rotational position sensor with respect to the housing. The casing is fixed to the housing for covering the rotational position sensor and the circuit substrate. The heat conductive member having electrical insulating and heat conductive properties as well as flexibility is disposed between the circuit substrate and the casing and closely attached to the casing.

According to the heat radiation structure of an electric apparatus of the present invention, heat generated from electronic components is released to the outside via the heat conductive member and the casing. Since the heat conductive member having electrical insulating and heat conductive properties as well as flexibility is attached closely to the casing, the heat generated from the electronic components may easily be released.

More specifically, the heat radiation structure of an electric apparatus, which is to be applied to a motor apparatus, comprises a motor section including a shaft whose one end projects from the housing, a rotational position sensor disposed outside of the housing for detecting a rotational position of the shaft, the circuit substrate disposed more outward than the rotational position sensor with respect to the housing and having the plurality of electronic components mounted thereon, and the casing fixed to the housing and covering the rotational position sensor and the circuit substrate. Here, the plurality of electronic components form a signal processing circuit for processing signals based on an output signal emitted from the rotational position sensor. According to the present invention, the casing includes a casing body formed of an electrical insulating material and an electromagnetic wave shielding member made of a metal and disposed on an inner wall surface of the casing body without being in contact with the housing. The casing body is formed with an opening portion opened toward the housing, and includes an opposed wall portion opposed to the opening portion. The electromagnetic wave shielding member is fixed to the opposed wall portion. The heat conductive member having electrical insulating and heat conductive properties as well as flexibility is disposed between the circuit substrate and the electromagnetic wave shielding member and closely attached to the electromagnetic wave shielding member.

According to the heat radiation structure of an electric apparatus of the present invention, heat generated from the electronic components is released to the outside via the heat conductive member, electromagnetic wave shielding member and the casing body. Here, the heat generated from the electronic components may easily be released to the outside by means of the heat conductive member and the electromagnetic wave shielding member. In addition, according to the present invention, since the electromagnetic wave shielding member is not in contact with the housing, heat generated on the side of the motor section is not allowed to be conducted from the housing to the electromagnetic wave shielding member.

The casing body is formed with an opening portion opened toward the housing, and includes an opposed wall portion opposed to the opening portion and a cylindrical peripheral wall portion extending from a peripheral end of the opposed wall portion toward the housing. The electromagnetic wave shielding member includes a first portion extending along the opposed wall portion of the casing body and a second portion extending along the peripheral wall portion, and is fixed to the opposed wall portion of the casing body. In this manner, heat conducted to a central portion of the first portion of the electromagnetic wave shielding member is radially released toward the cylindrical second portion. As a result, heat radiation is conducted effectively, thereby increasing heat radiation effects.

A gap may be formed between the second portion of the electromagnetic wave shielding member and the peripheral wall portion of the casing body. In this manner, it may be possible to prevent the heat generated on the side of the motor section from conducting or transferring from the housing to the electromagnetic wave shielding member.

The second portion of the electromagnetic wave shielding portion may be attached to the peripheral wall portion of the casing body. In this manner, the electromagnetic wave shielding member may firmly be fixed to the casing body.

The heat conductive member may mainly be formed of a silicon or acrylic resin. Such materials are commercially available at low cost.

If at least one of the electronic components is mounted on the circuit substrate via a lead terminal, the lead terminal might be corroded due to a corrosive material contained in the heat conductive member. For example, if the heat conductive member is made of an acrylic resin, the lead terminal might be corroded due to an acrylic acid contained therein. For this reason, a heat-resistant protective sheet may preferably be attached to a surface of the heat conducive member that faces the circuit substrate so that the heat-resistant protective sheet may allow heat conduction from the electronic components to the heat conductive member and may not allow the heat conductive member to contact the lead terminal to prevent the lead terminal from becoming corroded due to a corrosive material contained in the heat conductive member. In this manner, simply attaching the heat-resistant protective sheet may suppress the corrosion of lead terminals.

Preferably, the heat-resistant protective sheet may have at least one through-hole formed therein for allowing component bodies of the at least one of the electronic components to contact the heat conductive member. In this manner, since the heat conductive member readily adheres to a solid, the heat conductive member is well attached to the electronic components to stably fix the heat conductive member and the heat-resistant protective sheet within the motor.

The heat-resistant protective sheet may be formed of various kinds of materials in different thickness. For example, if PET (polyethylene terephthalate) material is used, a preferred thickness is 50 to 200 μm. If the thickness is less than 50 μm, the heat-resistant protective sheet might be broken under the stress given by the heat conductive member. If the thickness is more than 200 μm, heat conduction from the electronic components to the heat conductive member may be disturbed.

DESCRIPTION OF EMBODIMENTS

Figure 1:
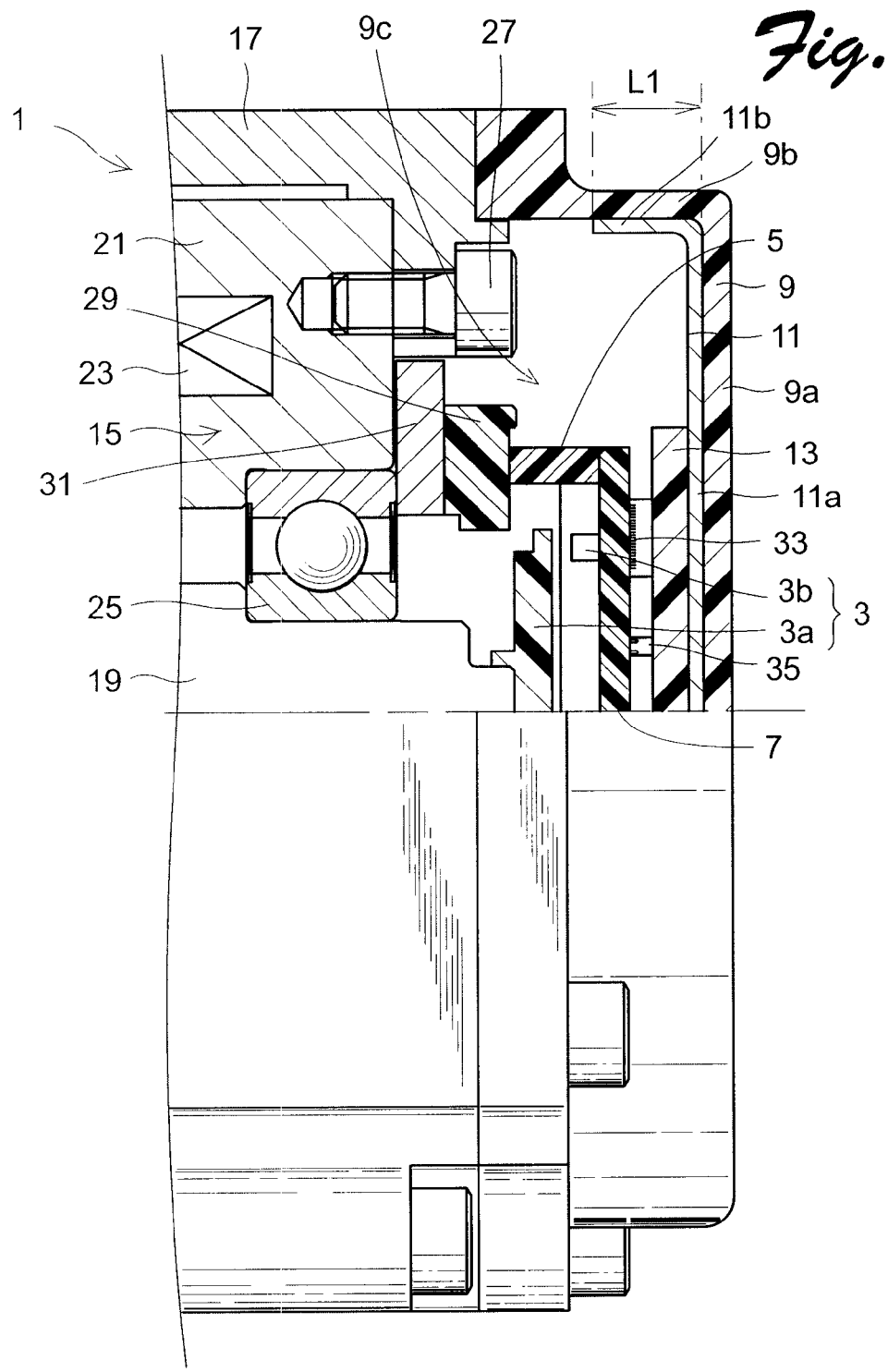
FIG. 1 is a partially cut-away view of a heat radiation structure of an electric apparatus according to an embodiment (a first embodiment) of the present invention, which is applied to a motor apparatus.
Figure 2:
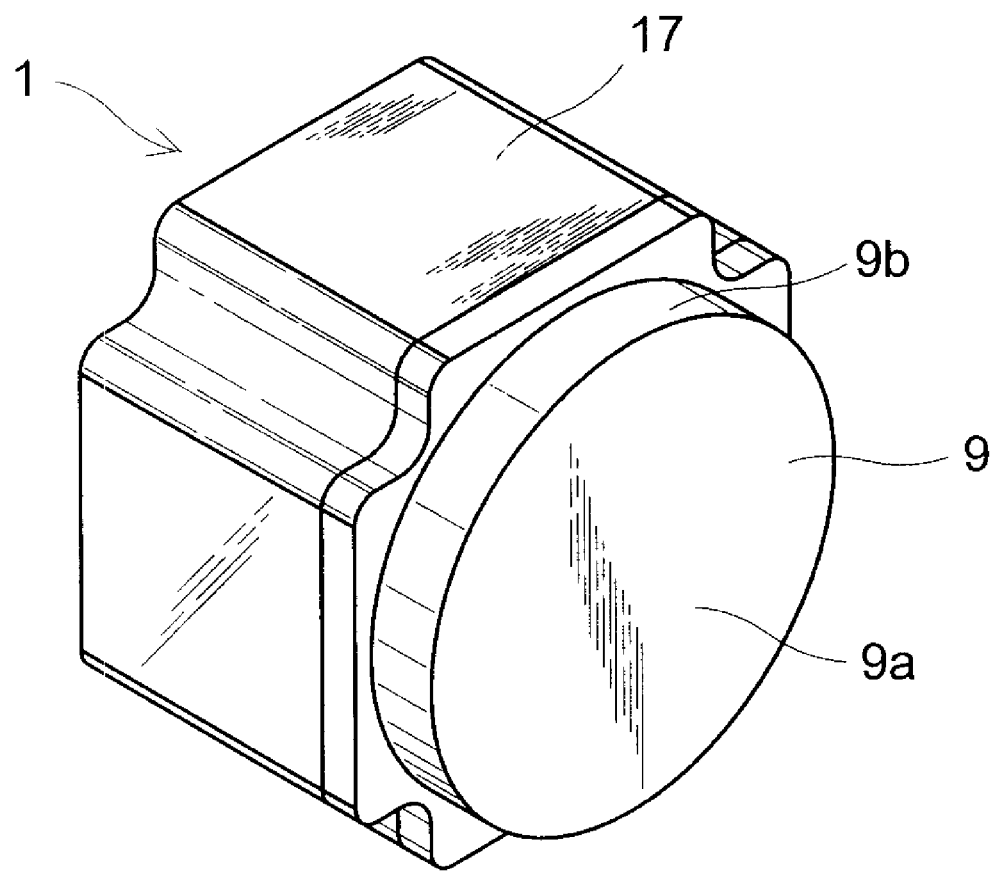
FIG. 2 is a perspective view partially showing the heat radiation structure of FIG. 1 as viewed from the casing body side.

Embodiments of the present invention will now be described in detail with reference to the drawings. FIG. 1 is a partially cut-away view of a heat radiation structure of an electric apparatus according to a first embodiment of the present invention, which is applied to a motor apparatus. FIG. 2 is a perspective view of the heat radiation structure of the electric apparatus of FIG. 1 as viewed from the side of a casing body 9 to be described later. As shown in FIG. 1, a motor apparatus provided with the heat radiation structure according to the present embodiment includes a motor section 1, a rotational position sensor 3, a circuit substrate supporting portion 5, a circuit substrate 7, a casing body 9, an electromagnetic wave shielding member 11, and a heat conductive member 13. The motor section 1 includes an electromagnetic brake 15, a housing 17, and a shaft 19 whose one end projects from the housing 17. The electromagnetic brake 15 includes a brake core 21 and an electromagnetic coil 23. The brake core 21 rotatably supports the shaft 19 via a ball bearing 25. A motor stator and a motor rotor, not illustrated, are disposed on the left side of the electromagnetic brake 15 as seen on the paper. The electromagnetic brake 15 is fixed to the housing 17 with a screw 27.

The rotational position sensor 3 is a magnetic rotary encoder disposed outside of the housing 17. The rotational position sensor 3 includes a rotational body 3a fixed to a non-load end of the shaft 19 and a magnetic detector 3b fixed to the circuit substrate 7. The magnetic detector 3b is disposed outside of the shaft 19 to face a plurality of permanent magnets included in the rotational body 3a for detecting the rotational position of the shaft 19 by detecting the magnetic flux of the plurality of permanent magnets. An optical rotary encoder may also be used as the rotational position sensor.

The circuit substrate supporting portion 5 is formed of a resin and into a cylindrical shape. The circuit substrate supporting portion 5 is fixed to the brake core 21 via connection devices 29 and 31.

Figure 3:
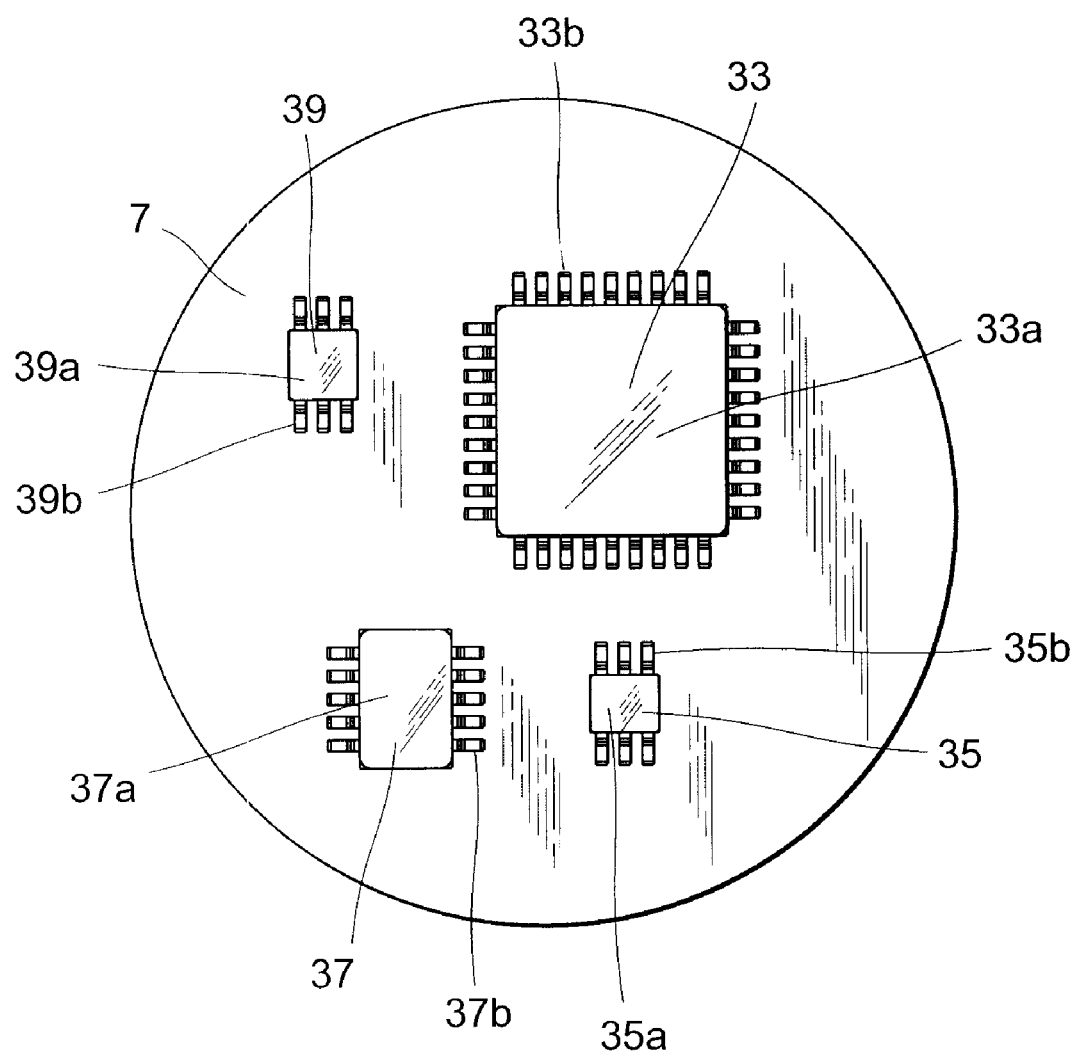
FIG. 3 is a plan view of a circuit substrate of FIG. 1 having electronic components mounted thereon.

The circuit substrate 7 is located more outward than the rotational position sensor 3 with respect to the housing 17, with its peripheral end supported by the circuit substrate supporting portion 5. As shown in FIG. 3, four electronic components 33 to 39 including integrated circuits are mounted on a surface of the circuit substrate 7, the surface being opposed to the casing body 9. The electronic components 33 to 39 form a signal processing circuit for signal processing based on an output signal outputted from the rotational position sensor 3. The electronic components 33 to 39 each have component bodies 33a to 39a and a plurality of lead terminals 33b to 39b connected to the component bodies 33a to 39a. Those electronic components 33 to 39 are mounted onto the circuit substrate 7 via the plurality of lead terminals 33b to 39b respectively.

The casing body 9 is made of an electrical insulating material such as a synthetic resin and is fixed to the housing 17 to cover the rotational position sensor 3, the circuit substrate supporting portion 5, and the circuit substrate 7. The casing body 9 is constituted from an opposed wall portion 9a and a peripheral wall portion 9b. The casing body 9 is formed with an opening portion 9c opened toward the housing 17, and the opposed wall portion 9a is opposed to the opening portion 9c. The peripheral wall portion 9b is cylindrical in shape, and extending from the peripheral end of the opposed wall portion 9a toward the housing 17.

The electromagnetic wave shielding member 11 is made from a cold-rolled magnetic steel plate, and is constituted from a first portion 11a extending along and attached to an inner wall surface of the opposed wall portion 9a of the casing body 9 and a second portion 11b extending from a peripheral end of the first portion 11a and attached to an inner wall surface of the peripheral wall portion 9b of the casing body 9. In this manner, the electromagnetic wave shielding member 11 is fixed to the opposed wall portion 9a of the casing body 9 so that the first portion 11a is opposed to the plurality of electronic components on the circuit substrate 7. A gap is formed between the housing 17 and an end portion of the second portion 11b, the end portion being located on the side of the motor section 1. The second portion 11b extends along the peripheral wall portion 9b without being in contact with the housing 17. According to the present embodiment, the casing body 9 is formed by injection molding using the electromagnetic wave shielding member 11 as an insert. The electromagnetic wave shielding member 11 has a function of shielding an electromagnetic wave applied from the outside of the motor apparatus to the plurality of electronic components 33 to 39 and to the rotational position sensor 3. According to the present embodiment, the casing body 9 and the electromagnetic wave shielding member 11 constitute the casing.

The heat conductive member 13 is a sheet which has electrical insulating property, heat conductivity and flexibility, has a thickness of 3 to 7 mm, and is mainly made of a silicone or acrylic resin. The heat conductive member 13 is disposed between the circuit substrate 7 and the electromagnetic wave shielding member 11 to be in close contact with the plurality of electronic components 33 to 39 and the first portion 11a of the electromagnetic shielding member 11. More specifically, the heat conductive member 13 is connected to the plurality of electronic components 33 to 39 to cover the plurality of electronic components 33 to 39. According to the present embodiment, a heat dissipation silicone rubber manufactured by Shin-Etsu Chemical CO., Ltd. is employed as the heat conductive member 13. Because of its flexibility, the heat conductive member 13 may increase an area in contact with the plurality of electronic components 33 to 39 without damaging the electronic components.

In the heat radiation structure according to the present embodiment, heat generated from the plurality of electronic components 33 to 39 is released to the outside via the heat conductive member 13, the electromagnetic wave shielding member 11, and the casing body 9. According to the present embodiment, the heat is easily released to the outside by means of the heat conductive member 13 and the electromagnetic wave shielding member 11. Further, since the heat conducted to a central portion of the first portion 11a of the electromagnetic wave shielding member 11 is released toward the second portion 11b (or a peripheral end portion of the first portion 11a), heat radiation is conducted effectively, thereby increasing heat radiation effects. Since the second portion 11b of the electromagnetic wave shielding member 11 is not in contact with the housing 17, heat generated on the side of the motor section 1 and emitted from the housing 17 does not reach the electromagnetic wave shielding portion 11.

Figure 4:
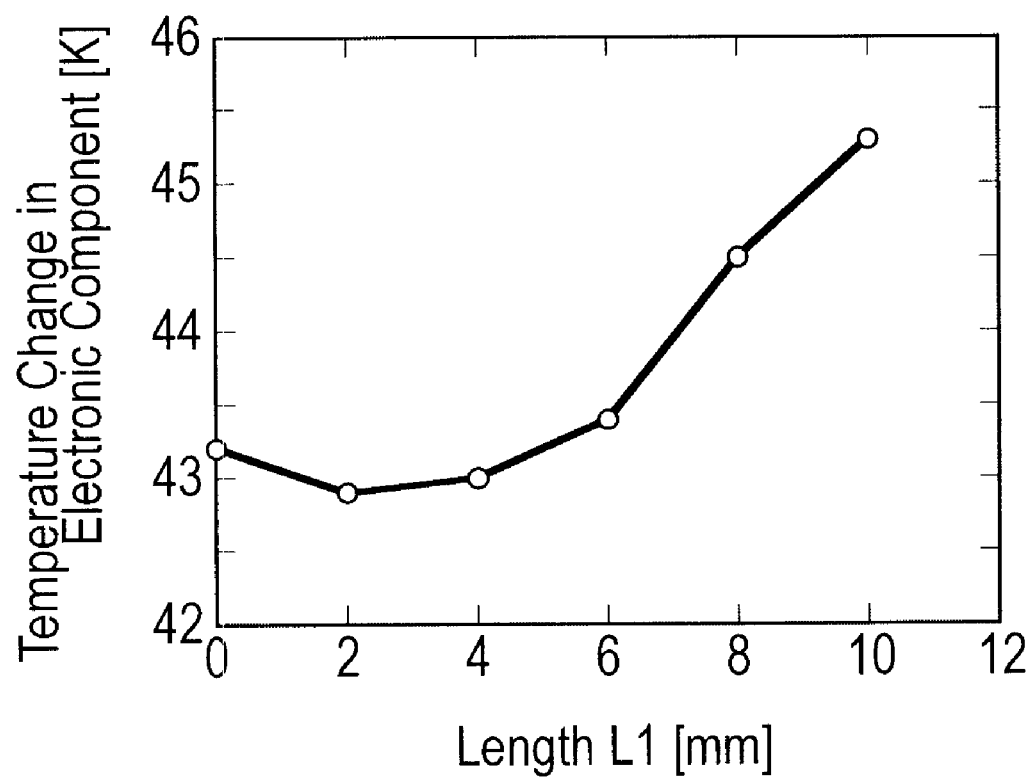
FIG. 4 is a graph showing the relationship between the temperature change in the electronic component relative to the room temperature and axial length of a second portion of the motor apparatus of FIG. 1 when the axial length is varied.

Next, a motor apparatus, to which the heat radiation structure of the present embodiment was applied, was continuously operated for three to four hours with rated power by varying an axial length L1 of the second portion 11b of the motor apparatus. The saturation temperature of the electronic components 33 to 39 was measured to examine the relationship between the length L1 and the change of temperature of the electronic components 33 to 39 relative to the room temperature. The results of the measurement are shown in FIG. 4. Here, the second portion 11b will be in contact with the housing 17 if the axial length of the second portion 11b is 10 mm. As is known from FIG. 4, the temperature rise of the electronic components 33 to 39 may be most effectively suppressed if the axial length L1 of the second portion 11b is 2 mm. If the length L1 is shorter than 2 mm, it becomes difficult for the electromagnetic wave shielding member 11 to enhance the heat radiation effects. If the length L1 exceeds 2 mm, heat generated on the side of the motor section 1 reaches the electromagnetic wave shielding member 11 and it becomes difficult for the electromagnetic wave shielding member 11 to enhance the heat radiation effects. Here, in the motor apparatus of the first embodiment, the axial length L1 of the second portion 11b of the electromagnetic wave shielding member 11 was set to 8 mm, taking into consideration the shielding and heat radiation effects of the electromagnetic wave shielding portion.

Figure 5:
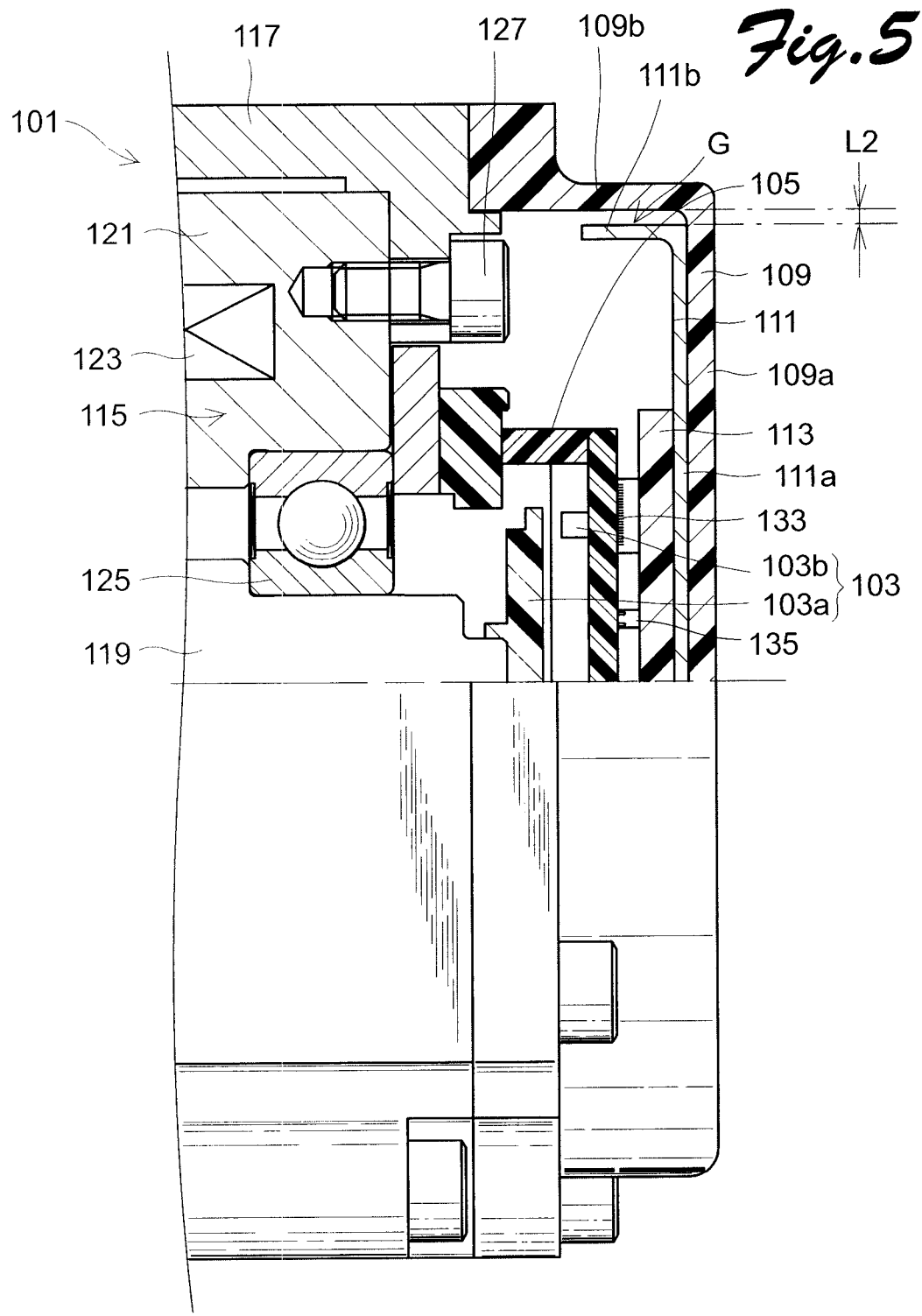
FIG. 5 is a partially cut-away view of a heat radiation structure according to another embodiment (a second embodiment) of the present invention.

FIG. 5 is a partially cut-away view of a heat radiation structure of an electric apparatus according to a second embodiment of the present invention. The heat radiation structure of the present embodiment is configured similarly to that of the motor apparatus of FIG. 1 except for an electromagnetic wave shielding member 111. Accordingly, parts whose configurations are similar to those of the corresponding heat radiation structure of FIG. 1 have reference numerals calculated by adding a number 100 to the reference numerals of the corresponding heat radiation structure of FIG. 1, and their explanations will be omitted. In the heat radiation structure according to the present embodiment, a second portion 111b of an electromagnetic wave shielding member 111 is configured not to be in contact with an inner wall surface of a peripheral wall portion 109b of a casing body 109. In this manner, a gap G is formed between the peripheral wall portion 109b and the second portion 111b. According to the present embodiment, the gap distance L2 between the peripheral wall portion 109b and the second portion 111b is a several hundred μm or more.

According to the heat radiation structure of the present embodiment, the gap G between the peripheral wall portion 109b of the casing body 109 and the second portion 111b of the electromagnetic wave shielding member 111 may make further contribution to preventing the conduction of heat generated on the side of a motor section 101 and transferred from a housing 117 to the electromagnetic wave shielding member 111.

Subsequently in the test, motor apparatuses provided with various heat radiation structures were continuously operated with rated power about three to four hours, and temperature change of electronic components relative to the room temperature was measured. Results of the measurement are shown in Table 1.

TABLE 1

| Motor | Comparative Example 1 | Comparative Example 2 | Embodiment 1 | Embodiment 2 | Embodiment 3 |
|---|---|---|---|---|---|
| Temperature Change (K) | 67.0 | 59.0 | 45.1 | 41.3 | 49.8 |

The heat radiation structure of a first comparative example of the above Table 1 was configured similarly to that of the first embodiment of FIG. 1 except that the casing body 9 was formed by machining carbon steel, and neither an electromagnetic wave shielding member 11 nor a heat conductive member 13 was provided. The heat radiation structure of the second comparative example was configured similarly to that of the first embodiment of FIG. 1 except that neither an electromagnetic wave shielding member 11 nor a heat conductive member 13 was provided. The heat radiation structure of the first embodiment is shown in FIG. 1, and that of the second embodiment is shown in FIG. 5. The heat radiation structure of the third embodiment is configured similarly to that of the first embodiment of FIG. 1 except that no electromagnetic wave shielding member 11 was provided and the heat conductive member was pressed between the electronic components and the casing body. Namely, in the heat radiation structure of the third embodiment, heat radiation is performed only by means of the heat conductive member 13.

As known from Table 1, heat radiation is more effectively performed in the heat radiation structures of the first to third embodiments than those of the first and second comparative examples. In particular, the heat radiation structure of the second embodiment or Embodiment 2 has the highest effect to suppress the temperature rise of electronic components owing to the gap provided between the peripheral wall portion and the second portion.

Figure 6:
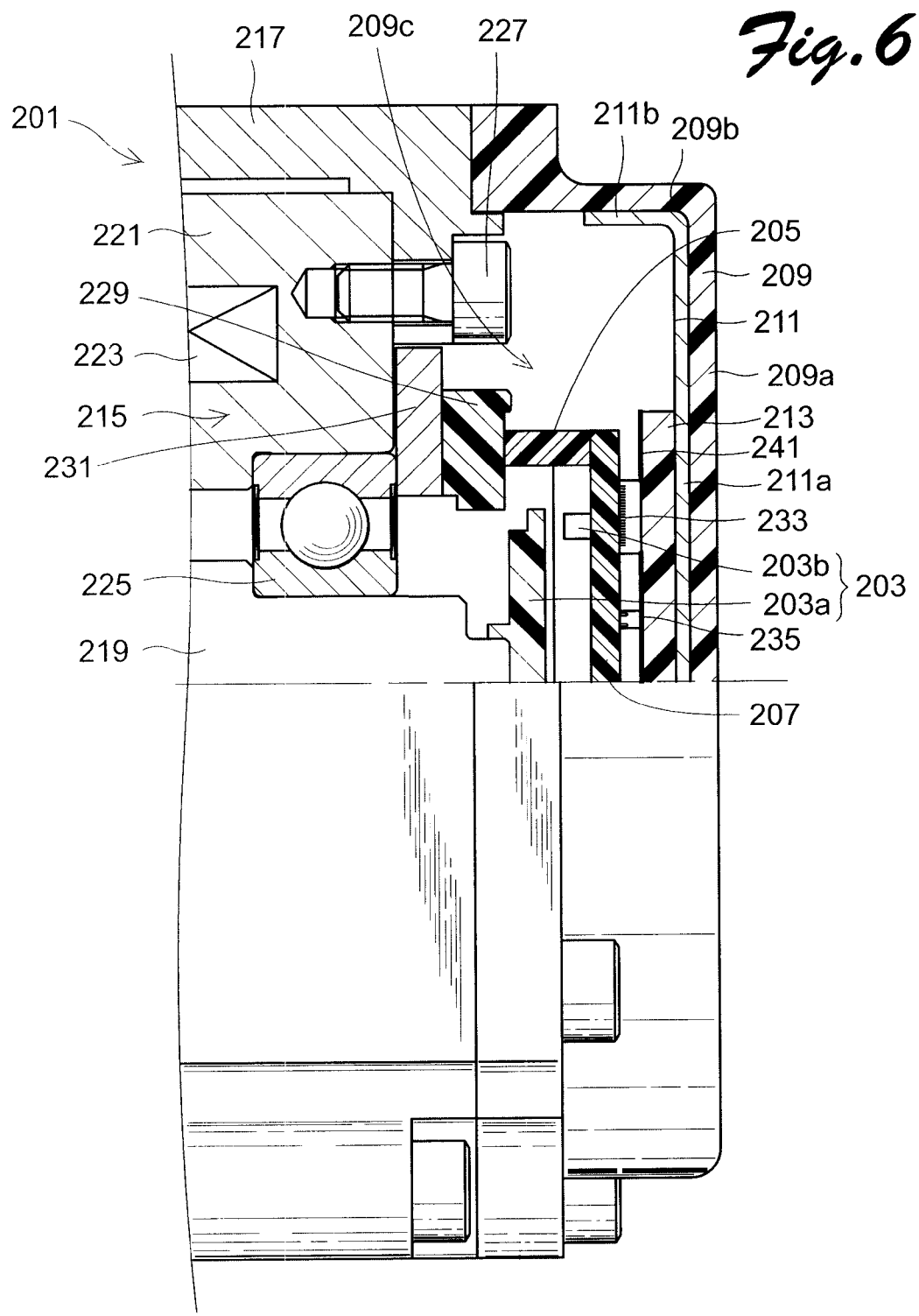
FIG. 6 is a partially cut-away view of a heat radiation structure of an electric apparatus according to still another embodiment of the present invention.
Figure 7:
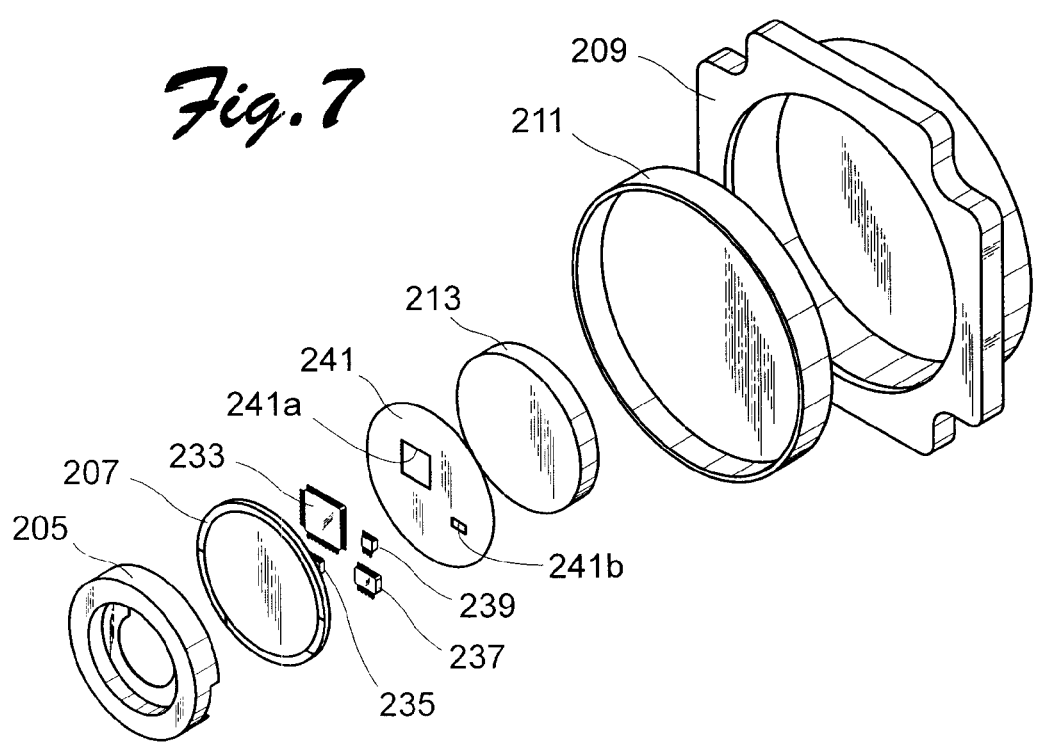
FIG. 7 is an exploded view of the heat radiation structure of FIG. 6.
Figure 8:
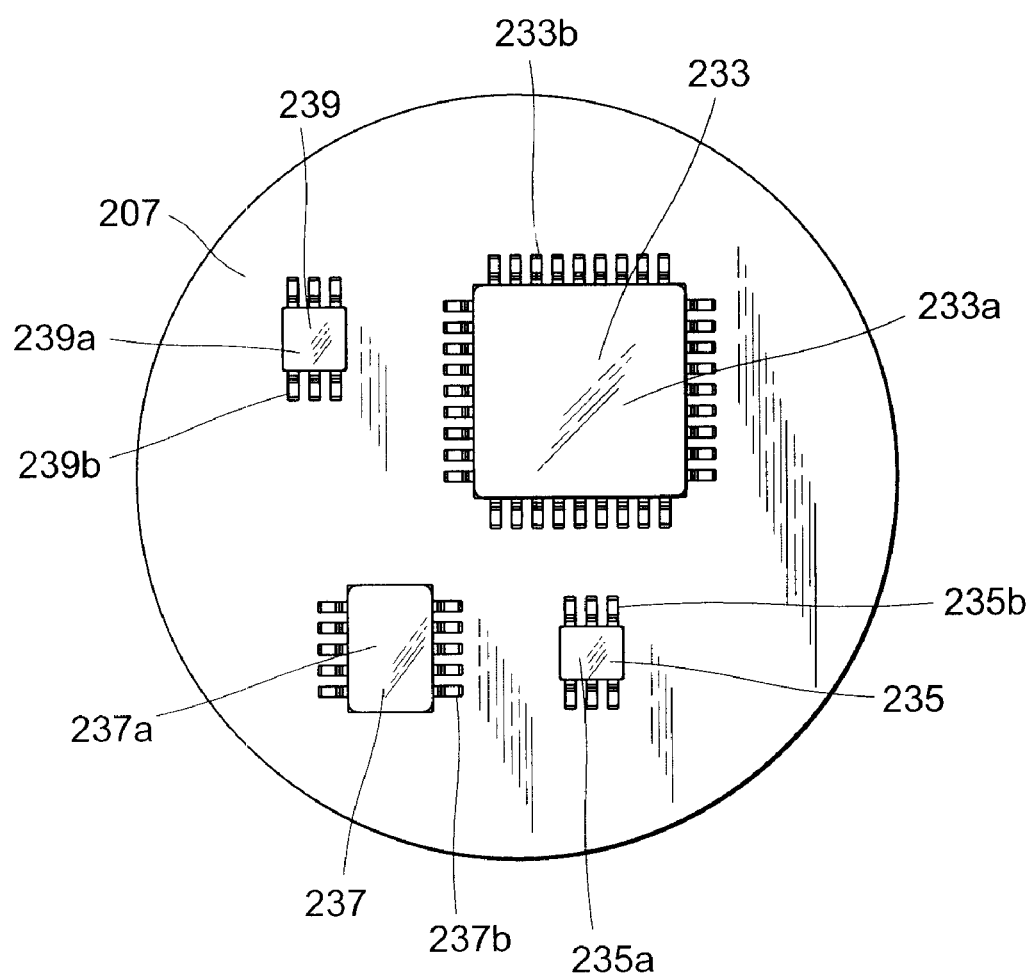
FIG. 8 is a plan view of a circuit substrate of FIG. 1 having electronic components mounted thereon.

FIG. 6 is a partially cut-away view of a heat radiation structure of an electric apparatus according to another embodiment of the present invention, and FIG. 7 is an exploded view thereof. The heat radiation structure of the present embodiment is configured similarly to that of the motor apparatus of FIG. 1 except for the presence of a heat-resistant protective sheet 241. Accordingly, the parts whose configurations are similar to those of the heat radiation structure of FIG. 1 have reference numerals calculated by adding a number 200 to the reference numerals of the corresponding parts of FIG. 1 and their explanations will be omitted. According to the heat radiation structure of the present embodiment, a heat-resistant protective sheet 241 is attached to a surface of the heat conductive member 213, the surface being opposed to a circuit substrate 207. As shown in FIG. 7, the heat-resistant protective sheet 241 is a circular disc in shape whose outer diameter dimension is similar to that of a heat conductive member 213. the heat-resistant protective sheet 241 is made of PET (polyethylene terephthalate) and has a thickness of 100 μm. PEN (polyethylene naphthalate) may also be used as a heat conductive material. Preferably, the thickness of the heat conductive member is 50 to 200 μm, taking into consideration thermal conductivity and other properties. Two through-holes 241a and 241b are formed in the heat-resistant protective sheet 241 so that a component body 233a of an electronic component 233 shown in FIG. 8 may be in contact with the heat conductive member 213 through the through-hole 241a and a component body 237a of an electronic component 237 may be in contact with the heat conductive member 213 through the through-hole 241b. In this manner, the heat conductive member 213 is closely attached to the electronic components 233 and 237 so that the heat conductive member 213 and the heat-resistant protective sheet 241 are stably fixed within the motor apparatus. Here, the component body 235a of the electronic component 235 and the component body 239a of the electronic component 239 are connected to the heat conductive member 213 via the heat-resistant protective sheet 241 so that heat generated in the electronic components 235 and 239 may be conducted to the heat conductive member 213 via the heat-resistant protective sheet 241. With the heat-resistance protective sheet 241 attached to the heat conductive member 213, the heat-resistant protective sheet 241 allows heat conduction from the electronic components 233 to 239 to the heat conductive member 213, and does not allow the heat conductive member 213 to contact lead terminals 233b to 239b of the electronic components 233 to 239 to prevent the lead terminals from becoming corroded due to a corrosive material contained in the heat conductive member 213. In the present embodiment, the lead terminals 233b to 239b might be corroded due to an acrylic acid if the heat conductive member 213 is made of an acrylic resin, but such problem may be avoided by means of the heat-resistant protective sheet 241.

According to the present invention, heat generated from electronic components may easily be released to the outside by means of the heat conductive member and the electromagnetic wave shielding member. According to the present invention, since heat conducted to a central portion of the first portion is radially released toward the second portion, heat radiation may be effectively conducted, thereby increasing heat radiation effects. Further, according to the present invention, since the second portion of the electromagnetic wave shielding member is not in contact with the housing, heat generated on the side of the motor section is not conducted from the housing to the electromagnetic wave shielding member. As a result, heat generated from the electronic components may easily be released to the outside to effectively prevent the heat conduction to the rotational position sensor.

The heat-resistant protective sheet, which allows heat conduction from electronic components to the heat conductive member and does not allow the heat conductive member to contact the lead terminals to prevent the lead terminals from becoming corroded due to a corrosive material contained in the heat conductive member, may be attached to the surface of the heat conductive member that faces the circuit substrate. In this manner, simple attachment of the heat-resistant protective sheet may prevent the corrosion of the lead terminals.

While certain features of the invention have been described with reference to example embodiments, the description is not intended to be construed in a limiting sense. Various modifications of the example embodiments, as well as other embodiments of the invention, which are apparent to persons skilled in the art to which the invention pertains are deemed to lie within the spirit and scope of the invention.

What is claimed is:

1. A heat radiation structure of an electric apparatus that comprises an electric device including a heat source therein; a housing for the electric device; a casing disposed outside of the housing; and a circuit substrate received in the casing and having a plurality of electronic components mounted thereon, the heat radiation structure comprising a heat conductive member having an electrical insulating and heat conductive properties and flexibility, the heat conductive member disposed between the circuit substrate and the casing and closely attached to the casing, wherein:

the plurality of electronic components are mounted on the circuit substrate;

at least one of the electronic components is mounted on the circuit substrate via a lead terminal; and a heat-resistant protective sheet is attached to a surface of the heat conductive member that faces the circuit substrate, the heat-resistant protective sheet allowing heat conduction from the electronic components to the heat conductive member and not allowing the heat conductive member to contact the lead terminals to prevent the lead terminals from becoming corroded due to a corrosive material contained in the heat conductive member.

2. The heat radiation structure of an electric apparatus according to claim 1, wherein the electric device is constituted from a motor section including a shaft whose one end projects from the housing; and the electric apparatus is constituted from a motor apparatus that comprises:

a rotational position sensor disposed outside of the housing for detecting a rotational position of the shaft;

the circuit substrate having the plurality of electronic components mounted thereon, and disposed more outward than the rotational position sensor with respect to the housing; and the casing fixed to the housing and covering the rotational position sensor and the circuit substrate.

3. The heat radiation structure of an electric apparatus according to claim 2, wherein the casing includes a casing body formed of an electrical insulating material and an electromagnetic wave shielding member made of a metal and disposed on an inner wall surface of the casing body; and the heat conductive member is closely attached to the electromagnetic wave shielding member.

4. The heat radiation structure of an electric apparatus according to claim 2, wherein the heat conductive member is mainly formed of a silicone or acrylic resin.

5. The heat radiation structure of an electric apparatus according to claim 1, wherein the casing includes a casing body formed of an electrical insulating material and an electromagnetic wave shielding member made of a metal and disposed on an inner wall surface of the casing body; and the heat conductive member is closely attached to the electromagnetic wave shielding member.

6. The heat radiation structure of an electric apparatus according to claim 5, wherein the casing body is formed with an opening portion opened toward the housing, and includes an opposed wall portion opposed to the opening portion and a cylindrical peripheral wall portion extending from a peripheral end of the opposed wall portion toward the housing;

the electromagnetic wave shielding member includes a first portion extending along the opposed wall portion of the casing body and a second portion extending along the peripheral wall portion, and is attached to the opposed wall portion.

7. The heat radiation structure of an electric apparatus according to claim 6, wherein a gap is formed between the second portion and the peripheral wall portion.

8. The heat radiation structure of an electric apparatus according to claim 6, wherein the second portion is attached to the peripheral wall portion.

9. The heat radiation structure of an electric apparatus according to claim 1, wherein the heat conductive member is mainly formed of a silicone or acrylic resin.

10. The heat radiation structure of an electric apparatus according to claim 1, wherein the heat-resistant protective sheet has at least one through-hole formed therein for allowing component bodies of the at least one of the electronic components to contact the heat conductive member.

11. The heat radiation structure of an electric apparatus according to claim 10, wherein the heat-resistant protective sheet is formed of PET having a thickness of 50 to 200 μm.

12. The heat radiation structure of an electric apparatus according to claim 1, wherein the heat-resistant protective sheet is formed of PET having a thickness of 50 to 200 μm.

\* \* \* \* \*